US006970815B1

(12) United States Patent
Bombal et al.

(10) Patent No.: US 6,970,815 B1
(45) Date of Patent: Nov. 29, 2005

(54) METHOD OF DISCRIMINATING BETWEEN DIFFERENT TYPES OF SCAN FAILURES, COMPUTER READABLE CODE TO CAUSE A DISPLAY TO GRAPHICALLY DEPICT ONE OR MORE SIMULATED SCAN OUTPUT DATA SETS VERSUS TIME AND A COMPUTER IMPLEMENTED CIRCUIT SIMULATION AND FAULT DETECTION SYSTEM

(75) Inventors: Jerome Bombal, La Trinite (FR); Laurent Souef, Montauroux (FR)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 09/443,883

(22) Filed: Nov. 18, 1999

(51) Int. Cl.[7] ............................................... G06F 17/50
(52) U.S. Cl. ........................... 703/15; 703/19; 716/6; 714/726; 714/729
(58) Field of Search .............................. 703/14, 15, 25, 703/19; 714/30, 776, 727, 729, 741, 726; 716/6

(56) References Cited

U.S. PATENT DOCUMENTS

| | | | |
|---|---|---|---|
| 5,253,255 A | | 10/1993 | Carbine |
| 5,331,570 A | * | 7/1994 | Bershteyn ..................... 716/4 |
| 5,404,526 A | | 4/1995 | Dosch et al. |
| 5,406,497 A | | 4/1995 | Altheimer et al. |
| 5,550,839 A | | 8/1996 | Buch et al. |
| 5,572,712 A | * | 11/1996 | Jamal ......................... 716/18 |
| 5,574,853 A | * | 11/1996 | Barch et al. .................. 714/30 |
| 5,596,585 A | * | 1/1997 | Njinda et al. ................ 714/733 |
| 5,633,813 A | * | 5/1997 | Srinivasan ................... 703/14 |
| 5,684,808 A | | 11/1997 | Valind |
| 5,689,517 A | | 11/1997 | Ruparel |
| 5,696,771 A | | 12/1997 | Beausang et al. |
| 5,703,789 A | * | 12/1997 | Beausang et al. .............. 716/4 |
| 5,748,497 A | * | 5/1998 | Scott et al. ................. 702/181 |
| 5,812,561 A | | 9/1998 | Giles et al. |
| 5,831,868 A | | 11/1998 | Beausang et al. |
| 5,831,993 A | | 11/1998 | Graef |
| 5,862,149 A | | 1/1999 | Carpenter et al. |
| 5,903,578 A | * | 5/1999 | De et al. .................... 714/726 |
| 5,909,453 A | | 6/1999 | Kelem et al. |
| 5,910,958 A | * | 6/1999 | Jay et al. .................... 714/738 |
| 5,920,575 A | | 7/1999 | Gregor et al. |
| 5,983,376 A | * | 11/1999 | Narayanan et al. ......... 714/726 |
| 5,991,909 A | * | 11/1999 | Rajski et al. ............... 714/729 |
| 6,059,451 A | * | 5/2000 | Scott et al. ................. 714/726 |
| 6,175,946 B1 | * | 1/2001 | Ly et al. ........................ 716/4 |
| 6,256,770 B1 | * | 7/2001 | Pierce et al. ................. 716/18 |
| 6,463,560 B1 | * | 10/2002 | Bhawmik et al. ........... 714/733 |

OTHER PUBLICATIONS

Ghosh et al. "A Design-for-Testability Technique for Register-Transfer Level Circuits Using Control/Data Flow Extraction", IEEE Transactions on Computer Aided Design of Integrated Circuits and Systems, Aug. 1998, pp. 706-723.

(Continued)

*Primary Examiner*—B. D. Thomson
(74) *Attorney, Agent, or Firm*—Peter Zawilski

(57) ABSTRACT

A method of discriminating between different types of simulated scan failures includes simulating a scan enable signal to a circuit represented by a netlist corresponding to a scan chain coupled to combinatorial logic being tested, simulating initiation of a data capture cycle in the netlist corresponding to the scan chain, the data capture cycle simulating a series of scan flops from the scan chain being simulated together with the combinatorial logic and simulating scanning data out from each flop in the scan chain and into a test program. The test program extracts the simulated scan flops and graphically displays the simulated scan flops versus time.

24 Claims, 7 Drawing Sheets

OTHER PUBLICATIONS

Lin et al. "Cost-Free Scan: A Low-Overhead Scan Path Design", IEEE Transactions on Computer Aided Design of Integrated Circuits and Systems, Sep. 1998, pp. 852-861.

Lin et al. "Test-Point Insertion: Scan Paths Through Functional Logic", IEEE Transactions on Computer Aided Design of Integrated Circuits and Systems, Sep. 1998, pp. 838-851.

Runyon, Stan, "Testing Big Chips", IEEE Spectrum, Apr. 1999, pp. 49-55.

* cited by examiner

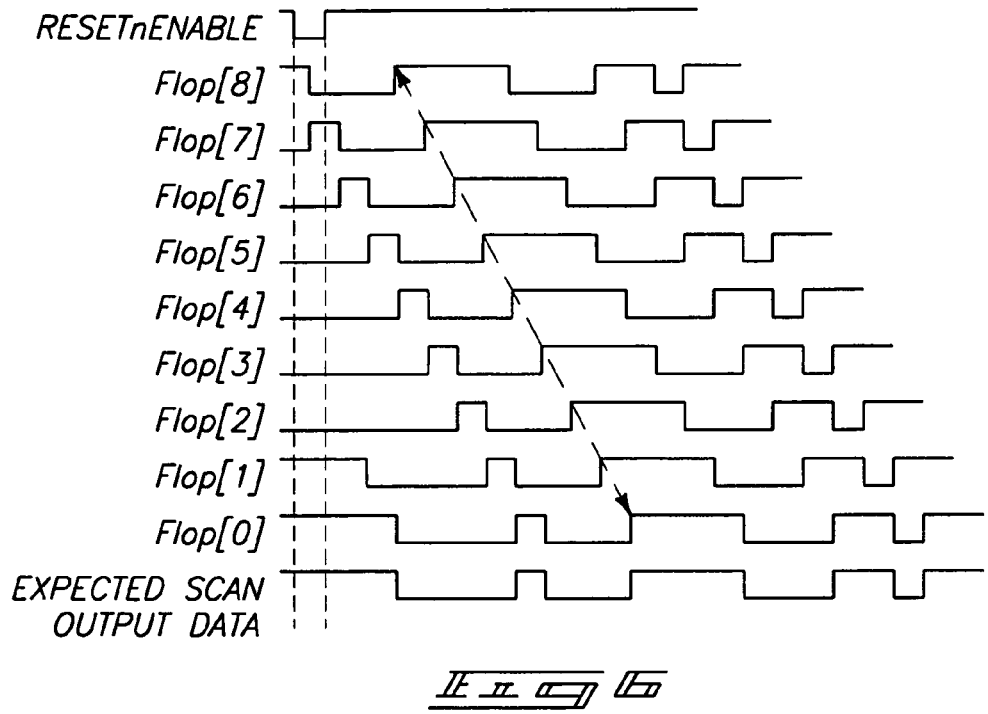
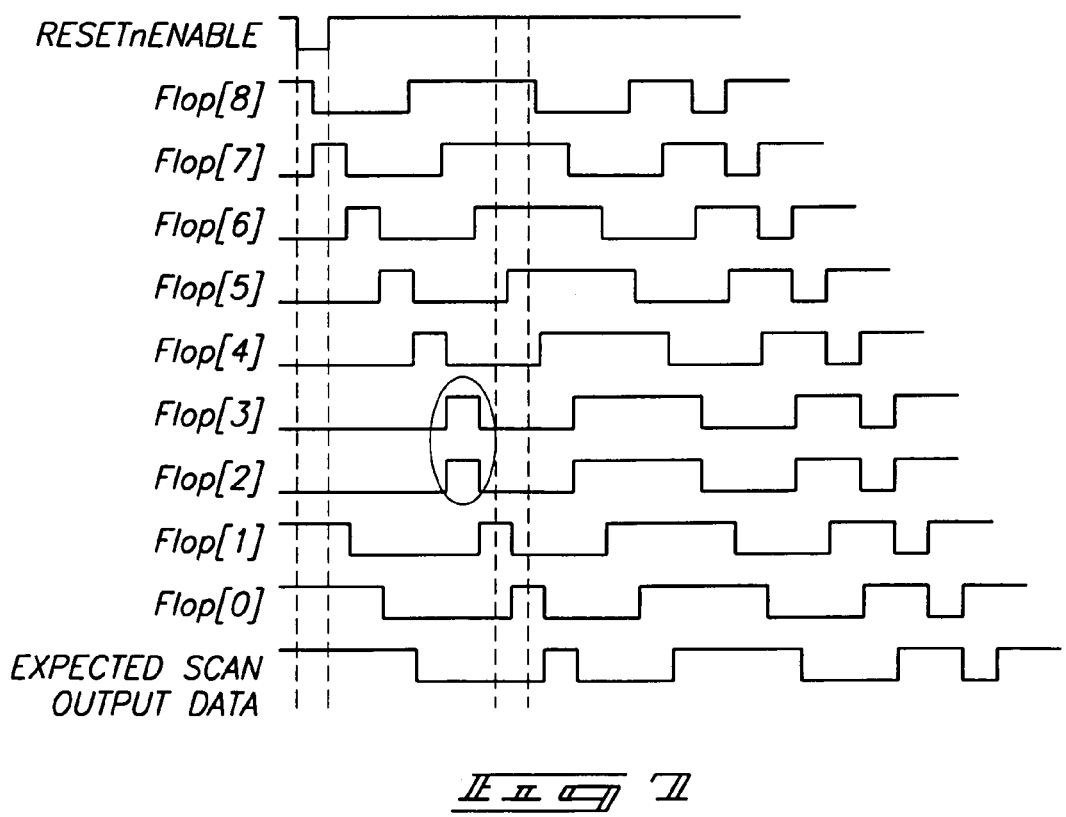

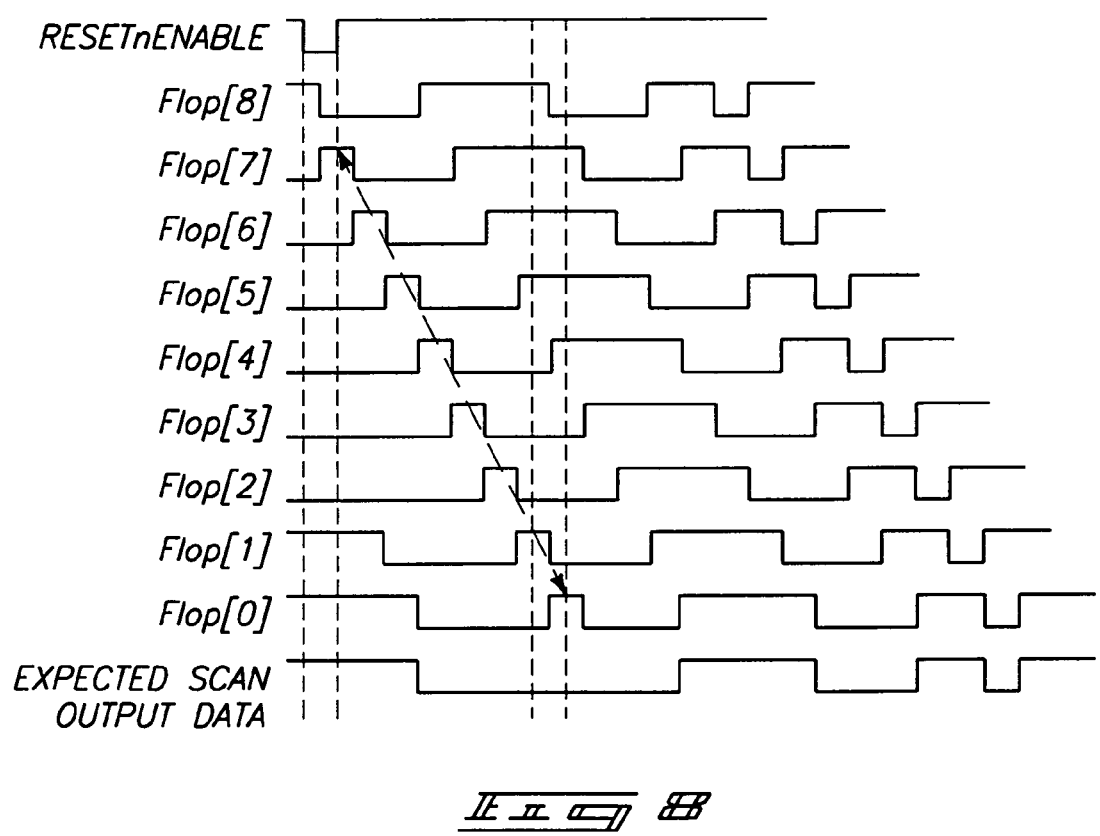

METHOD OF DISCRIMINATING BETWEEN DIFFERENT TYPES OF SCAN FAILURES, COMPUTER READABLE CODE TO CAUSE A DISPLAY TO GRAPHICALLY DEPICT ONE OR MORE SIMULATED SCAN OUTPUT DATA SETS VERSUS TIME AND A COMPUTER IMPLEMENTED CIRCUIT SIMULATION AND FAULT DETECTION SYSTEM

TECHNICAL FIELD

The present invention relates to a method of discriminating between different types of scan failures, computer readable code to cause a display to graphically depict one or more simulated scan output data sets versus time and a computer implemented circuit simulation and fault detection system.

BACKGROUND OF THE INVENTION

Integrated circuits have rapidly increased in complexity, operating speed and utility. One technique for specifying an integrated circuit design is with a hardware description language (HDL) such as VHDL. A hardware description language (HDL) enables representation of an integrated circuit design at a logical level, and provides a high level design language. An integrated circuit is represented in several different levels, comprising different layers of abstraction. Silicon compilers, comprising synthesis programs, are used to yield a final implementation wherein the programs generate sufficient detail to proceed directly to silicon fabrication.

A compiler generates a netlist of generic primitive cells during the processing of an HDL program. A netlist is a list of all the nets, or collection of pins needing to be electrically connected, in a circuit. The netlist consists of a detailed list of interconnections and logic components, and can include primitive cells such as XOR gates, NAND gates, latches and D-flip flops and their associated interconnections.

The silicon compiler first generates a netlist of independent cells, and then applies a particular cell library to the resulting generic netlist via a process called mapping. As a consequence, a dependent mapped netlist is generated which uses standard circuits that are available within a cell library and which are available to the computer system. Silicon compilers and mapping programs are well understood in the art, and are described in numerous patents including U.S. Pat. Nos. 5,406,497 and 5,831,868, which are hereby incorporated herein by reference.

As circuit complexity has grown, it has been increasing difficult and expensive to test functionality of integrated circuits. Strategies that have evolved to cope with this include design for testability (DFT), a feature placed into an integrated circuit whereby predetermined test control signals place the circuit into a test mode. Application of special test input signals from an automated test pattern generator (ATPG) to inputs to the integrated circuit results in a set of output signals. The output signals are compared to expected values in order to determine if the integrated circuit provided the expected values. When a discrepancy is noted between the output signals and the expected values, it is necessary to determine how the discrepancy arose in order to be able to propose a repair, re-design or other remedial measure.

In some types of DFT, after a test signal is used to set the integrated circuit into the test mode, sequential and combinatorial logic circuits are tested by interconnecting selected flip-flops within the integrated circuit into a shift register (also known as a "scan register") in the test mode using multiplexers. A test vector that includes known input signals is applied to portions of the integrated circuit, and the resultant output signals are first captured in parallel in, and then serially clocked (or "scan shifted") out of, the scan registers.

It is expensive to design and manufacture new integrated circuits. It is particularly expensive to manufacture prototype integrated circuits that do not operate as expected or desired. Accordingly, it is common to simulate operation of new designs as they are being developed in order to try to identify as many potential errors or problems as possible prior to finalizing and then manufacturing the prototype design.

Typical simulation software tools, such as those available from Mentor Graphics (Wilsonville, Oreg.) or Synopsys (Mountain View, Calif.), provide a text file output containing information regarding simulated scan shifting. A great deal of time and effort is often involved in tracing back from error flags in these text files, using netlist parsing and calculations, to determine where the problem actually lies. This process is also sufficiently complex that it is error-prone, at least in part because this process fails to provide any intuitive grasp of where the problem lies.

Problems that may occur during simulated output signal capture include bad sampling by the flip-flop during a capture cycle, due to a race condition or other problem, improper clocking behavior and improper reset behavior, both of which latter conditions may be caused by clock signal spikes. Problems that may occur during simulated scan shifting include clock skew issues leading to data loss in the register, an unexpected reset that destroys some scan data, a missing clock pulse due to dysfunctional clock gating or interruption of the scan chain, which may be due to bad gating or multiplexing.

What is needed is a tool that provides an intuitive understanding of signal flow in automated simulation of new integrated circuit designs, and that promotes ready and rapid discrimination between simulated shift-induced errors and simulated signal capture errors in integrated circuit designs incorporating design for testability.

SUMMARY OF THE INVENTION

The invention provides a method of discriminating between different types of scan failures. In one aspect of the invention, the method includes simulating a scan enable signal to a circuit represented by a netlist corresponding to a scan chain of flip-flops that are coupled together to form a shift register and that are also coupled to combinatorial logic being tested. The method also includes simulating initiation of a data capture cycle in the netlist corresponding to the scan chain, the data capture cycle simulating circuit operation to provide simulated output data including a series of scan flops from the scan chain being simulated together with the combinatorial logic. The method further includes simulating scanning data out from each flop in the scan chain and into a test program. The test program: extracts simulated scan flops from the simulated circuit operation data; sorts the simulated scan flops into a logical order; identifies labels for the simulated scan flops; and graphically displays the simulated scan flops versus time together with the labels.

In another aspect, the present invention includes an article of manufacture comprising a computer usable medium having computer readable code embodied therein to cause a display to graphically depict one or more simulated scan output data sets versus time. The computer readable program code in the article of manufacture includes a module to extract the simulated scan flops of one or more scan chains from the simulated scan output data, a module to sort the extracted simulated scan flops into a logical order, a module to identify labels for the simulated extracted scan flops and a module to graphically display the simulated scan flops versus time together with the labels.

In yet another aspect, the present invention includes a computer implemented circuit simulation and fault detection system. The system includes memory configured to provide a database and operative to store a netlist including nets of an integrated circuit under design, an automatic test pattern generation algorithm operative to design and simulate an integrated circuit design and processing circuitry configured to simulate operation of the integrated circuit design to provide simulated circuit operation data and to identify types of defects occurring during simulation of the integrated circuit design. The processing circuitry is operative to: extract simulated scan flops from the simulated circuit operation data; sort the simulated scan flops into a logical order; identify labels for the simulated scan flops; and graphically display the simulated scan flops versus time together with the labels.

BRIEF DESCRIPTION OF THE DRAWINGS

FIG. 6 is a simplified graph showing correct simulated test results corresponding to the circuit of FIG. 1 obtained via the system of FIG. 3 using the process of FIG. 5, in accordance with an embodiment of the present invention.

FIG. 7 is a simplified graph showing simulated test results indicative of a shift problem corresponding to the circuit of FIG. 1 obtained via the system of FIG. 3 using the process of FIG. 5, in accordance with an embodiment of the present invention.

FIG. 8 is a simplified graph showing simulated test results indicative of a capture problem from the circuit of FIG. 1 obtained via the system of FIG. 3 using the process of FIG. 5, in accordance with an embodiment of the present invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The present invention includes methods and apparatus for streamlining analysis of simulated test results from integrated circuits that include design for testability features. More particularly, the present invention permits graphical display of simulated test results in a manner facilitating rapid and robust determination of fault location and promoting intuitive fault localization.

In the following description, numerous specific details are set forth, such as particular architecture, hardware configurations etc., in order to provide a thorough understanding of the present invention. However, it will be apparent to one skilled in the art that the present invention may be practiced without these specific details. In other instances, well-known methods and hardware configurations are not described in detail in order to not obscure the present invention.

The present invention addresses problems encountered in simulation of testing of modern large scale integrated circuits that include design for testability features. The problems stem from the large amount of data generated during test simulation and from lack of an intuitive approach to sorting and analyzing the simulated test data.

Figure 1:
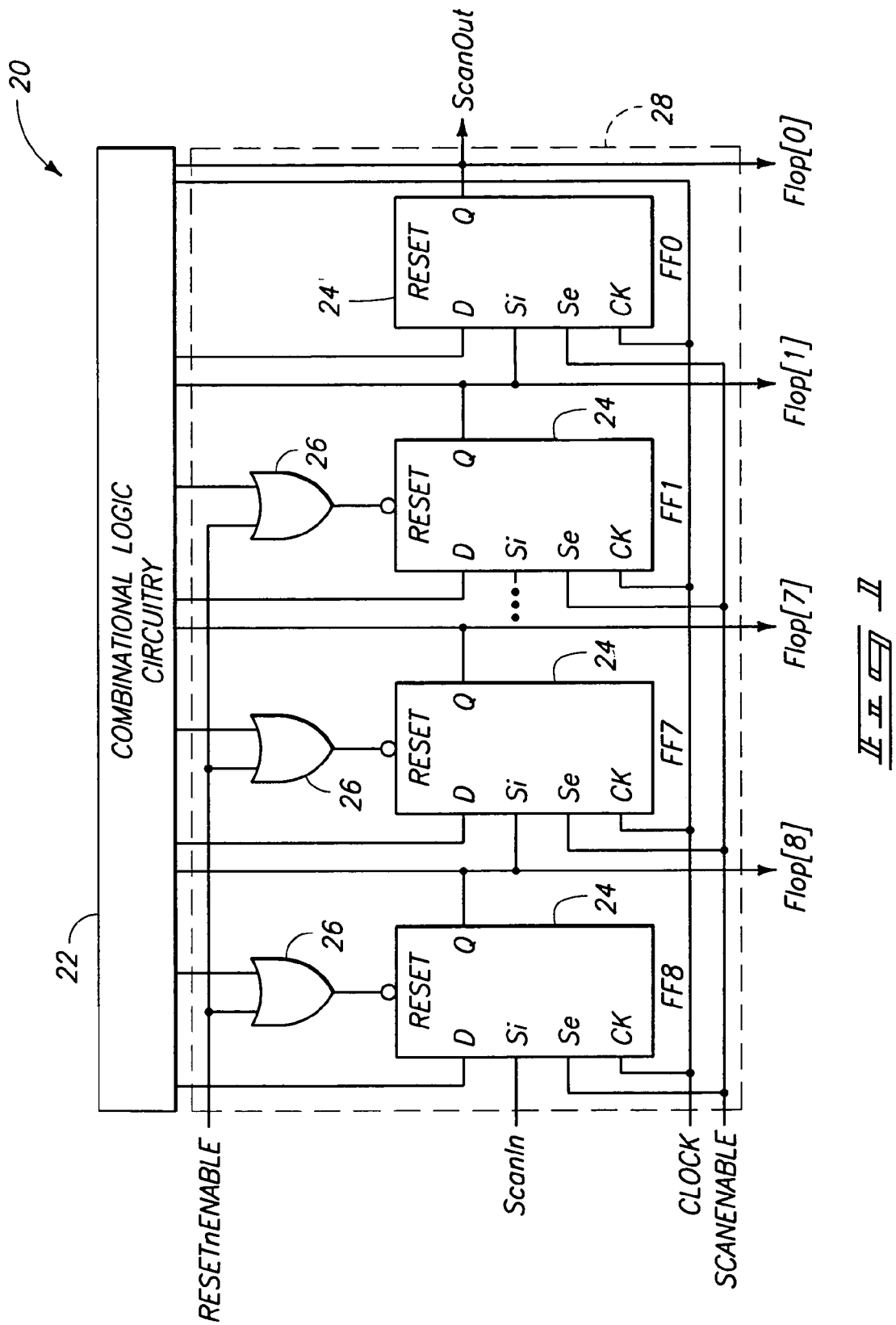
FIG. 1 is a simplified schematic diagram of a circuit including combinational logic circuit and scan flip-flops, in accordance with an embodiment of the present invention.
Figure 2:
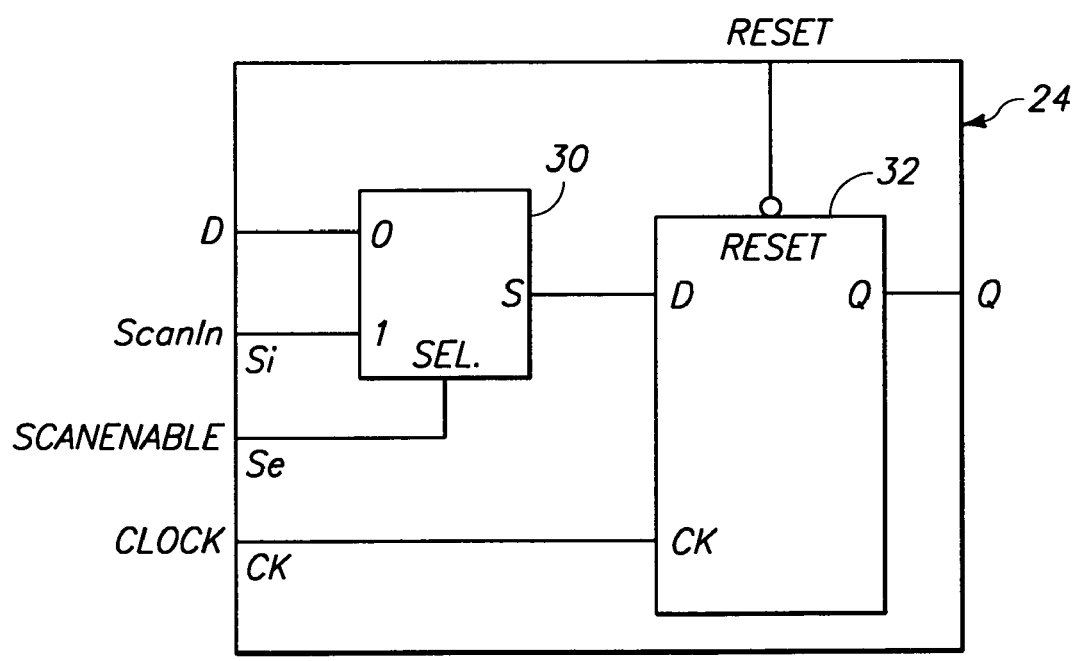
FIG. 2 is a simplified schematic diagram of one of the scan flip-flops of FIG. 1, in accordance with an embodiment of the present invention.
Figure 3:
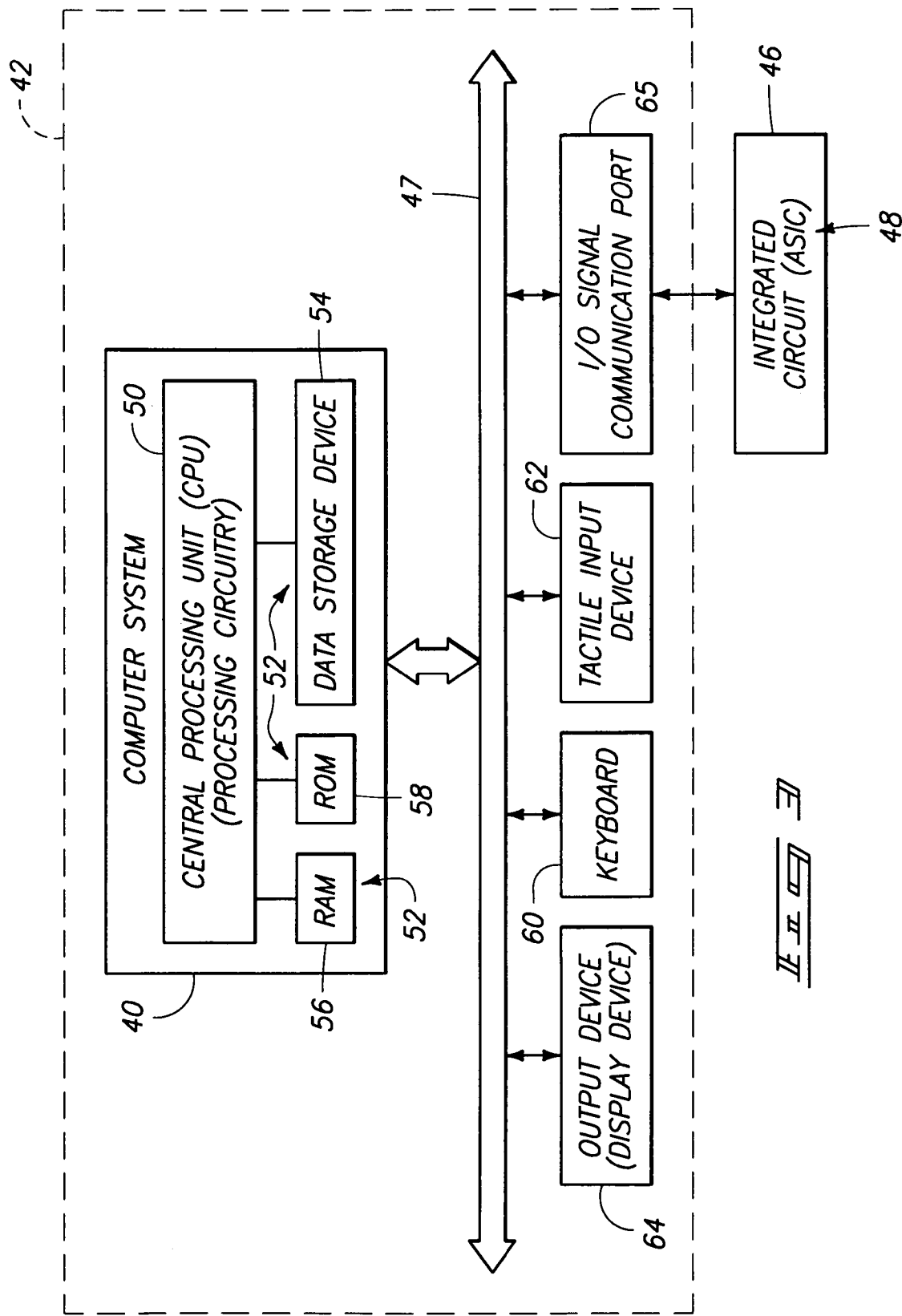
FIG. 3 is a simplified block diagram of a computer aided design (CAD) system coupled to an integrated circuit, in accordance with an embodiment of the present invention.
Figure 4:
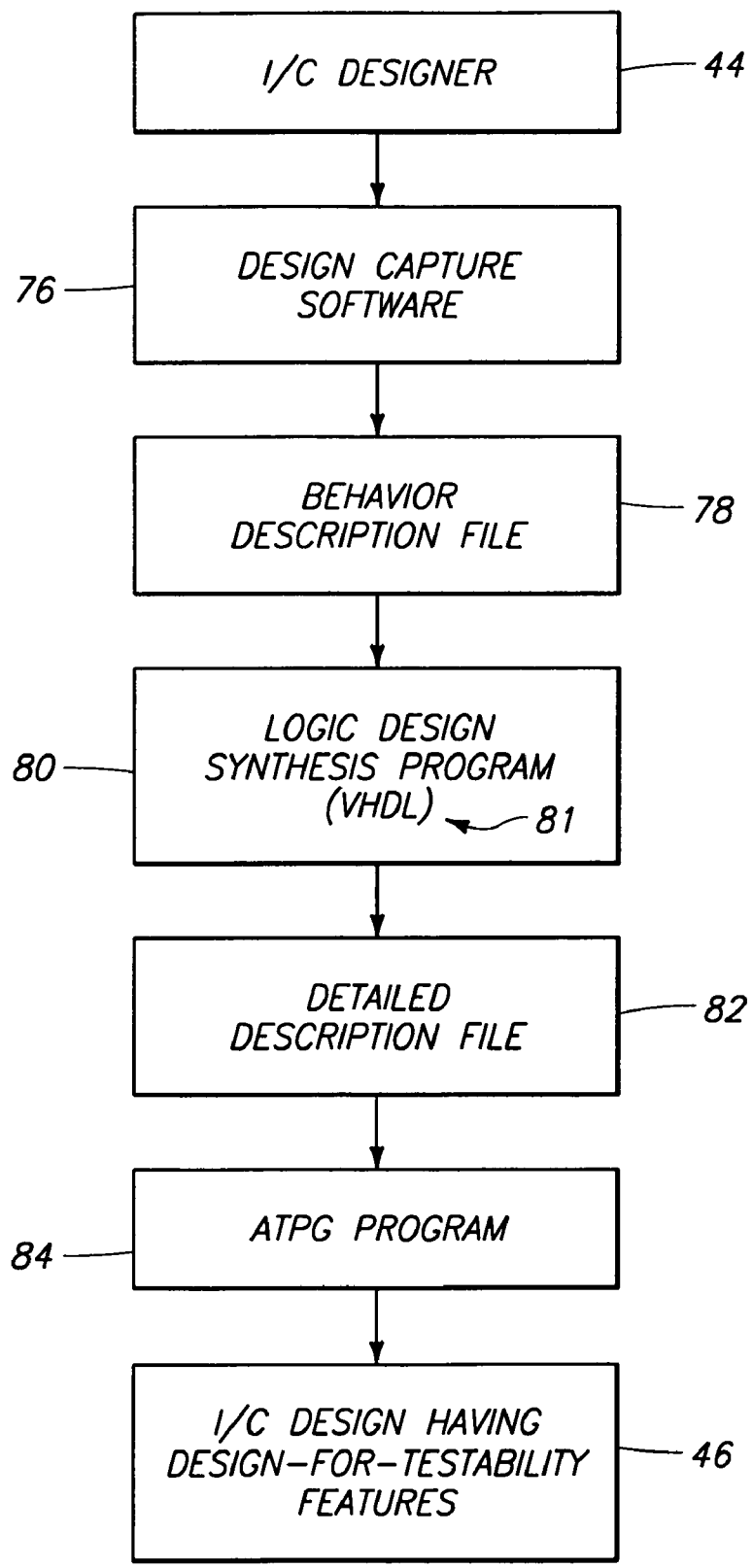
FIG. 4 is a simplified block diagram of the design process for an integrated circuit having design-for-testability features, in accordance with an embodiment of the present invention.
Figure 5:
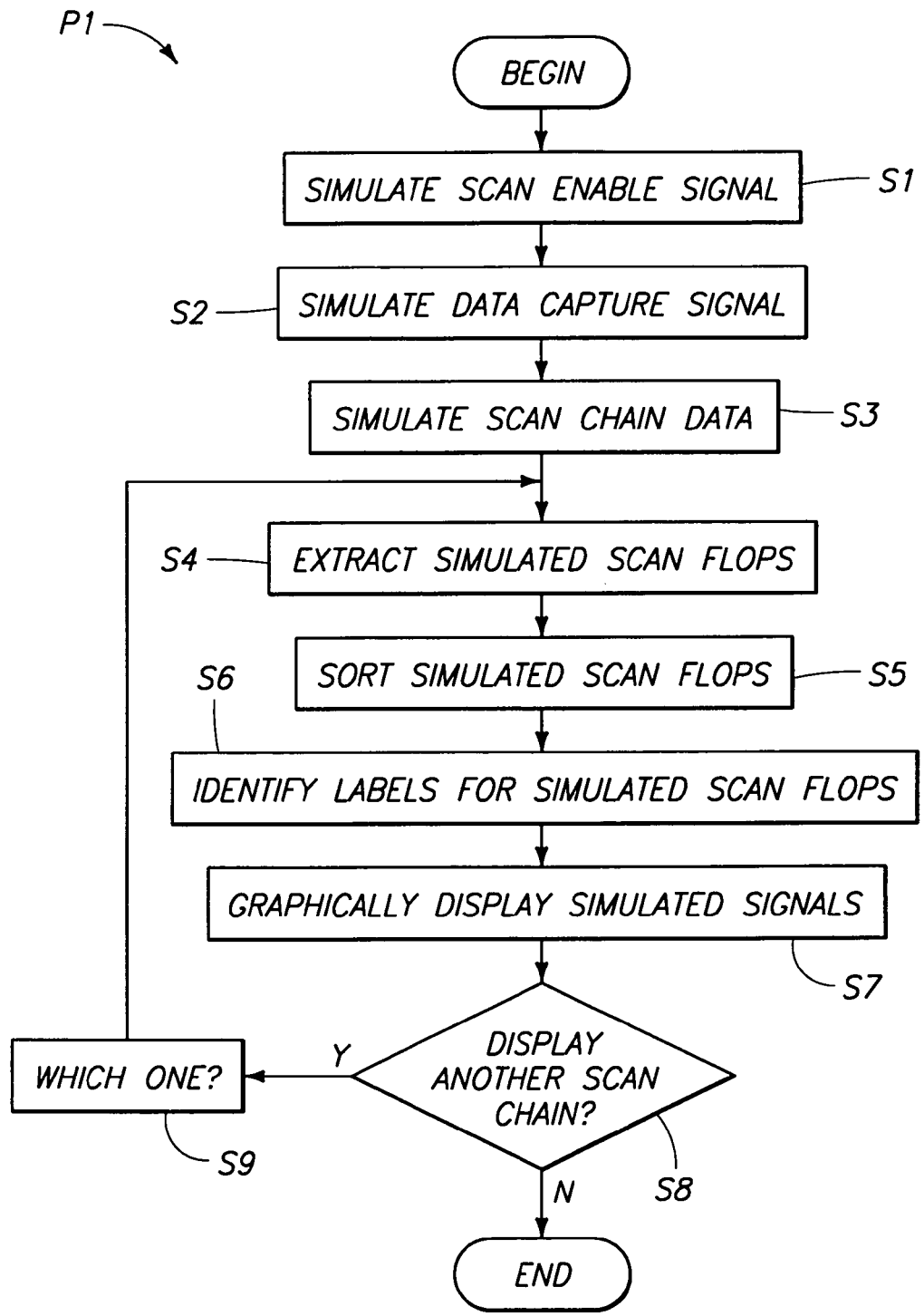
FIG. 5 is a simplified flow chart illustrating operation of an exemplary software module for processing and displaying simulated test data corresponding to the circuit of FIG. 1 via the system of FIG. 3, in accordance with an embodiment of the present invention.

FIGS. 1 and 2 describe operation and construction of integrated circuits using design for testability techniques. FIGS. 3 and 4 describe hardware and software used for simulating operation of such integrated circuits. FIG. 5 describes a process for interpreting the test results, and FIGS. 6 through 8 show results from the process of FIG. 5.

FIG. 1 is a simplified schematic diagram of a circuit 20 including combinational logic circuit 22 and scan flip-flops 24, in accordance with an embodiment of the present invention. The illustrated circuit 20 includes combinational logic circuitry 22 coupled with plural flip-flops 24 and control circuits 26, also known as glue logic. The flip-flops 24 are individually identified as FF0–FF8 in FIG. 1. Signals from the Q outputs of the flip-flops 24 corresponding to data captured from the combinational circuitry 22 are referred to as "flops." Circuit 20 can be implemented in many configurations, such as ASICs, controllers etc., including different combinational logic circuitry 22 in other embodiments. The illustrated flip-flops 24 comprise scan flip-flops and collectively form a shift register, known as a scan register 28. The scan register 28, together with the combinational logic 22 coupled to the scan register 28, are collectively known as a "scan chain." Other flip-flop or device configurations can be utilized in other circuit arrangements, such as level sensitive scan designs (LSSD). Examples of several types of scan chains, including those used in LSSD, are discussed in U.S. Pat. No. 5,920,575, entitled "VLSI Test Circuit Apparatus And Method" and issued to Gregor et al., and in U.S. Pat. No. 5,909,453, entitled "Lookahead Structure For Fast Scan Testing" and issued to Kelem et al., which patents are hereby incorporated herein by reference.

FIG. 2 is a simplified schematic diagram of the scan flip-flops 24 of FIG. 1, in accordance with an embodiment of the present invention. The scan flip-flops 24 individually include an internal multiplexer 30 coupled with an internal D-type flip-flop 32. The illustrated scan flip-flop 24 includes a D input and a scan-in input Si coupled to the multiplexer 30. An output S of the multiplexer 30 is coupled to a D input of the flip-flop 32.

An enable signal SCANENABLE is applied to a scan-enable input Se of the illustrated scan flip-flop 24 and to the multiplexer 30 to control the application of data from either the D input or the scan-in input Si to the D input of the flip-flop 32. A clock signal can also be applied to a clock input CK of the depicted scan flip-flop 24 and to the flip-flop 32 to control the timing of operations of the scan flip-flop 32. The Q output of the flip-flop 32 forms a Q output of the scan flip-flop 24. The illustrated scan flip-flop 24 also includes a control input which comprises a reset input in the depicted illustration. Other control inputs can be provided within individual scan flip-flops 32, such as a set input, for example.

Scan flip-flop configurations can be utilized to provide increased flexibility in circuit design. For example, scan flip-flops 24 can be utilized to implement test mode operations responsive to assertion of a test mode signal TESTMODE (not illustrated). The TESTMODE signal is selectively asserted by an external circuit tester (discussed below with reference to FIGS. 3 and 4) in the described embodiment. For example, the circuit 20 of FIG. 1 operates in a normal, functional mode when the TESTMODE signal is a logic "0." Alternatively, the circuit 20 operates in a test mode when the TESTMODE signal is a logic "1."

The SCANENABLE signal can additionally be utilized to control operation of the scan flip-flops 24. For example, when the SCANENABLE signal is a logic "0" during the test mode, operations are provided in a capture mode. Alternatively, when the SCANENABLE signal is a logic "1," operations are provided in a scan mode, also referred to as a shift mode.

In general, the SCANENABLE signal controls the application of data from the D input or the scan-in input Si to the Q output of individual scan flip-flops 24, corresponding to operation in the capture and scan modes, respectively. Data is received into the scan flip-flops 24 from the combinational logic circuitry 22 during capture operations. Such data can be subsequently scanned through the scan register 28 and out of the FF0 flip-flop 24 during scan modes of operation. Alternatively, scan-in data is applied to the scan flip-flops 24 and thus to the combinational logic circuitry 22 during scan modes of operation.

When the SCANENABLE signal is a logic "0," the D input of the scan flip-flop 24 coupled to the multiplexer 30 is coupled with the D input of the flip-flop 32. When the SCANENABLE signal is a logic "1," the scan-in input Si of the scan flip-flop 24 coupled to the Multiplexer 30 is coupled with the D input of the flip-flop 32. Accordingly, normal data from the logic circuitry 22 can be selectively applied via the D input into the scan flip-flops 24. Alternatively, scan data can be selectively inputted using the scan-in inputs Si into the scan flip-flops 24.

Referring again to FIG. 1, the circuit 20 operates in a functional mode and a test mode as previously described. The circuit 20 operates in the functional mode during normal operation, such as with an associated device in a given application. The circuit 20 can be coupled with a circuit tester (discussed below with reference to FIGS. 3 and 4) which performs testing operations during test mode operations.

The combinational logic circuitry 22 is coupled with individual control circuits 26. The control circuits 26 comprise OR gates in the described embodiment, corresponding to the reset inputs of the scan flip-flops 24 being active low. Alternatively, the control circuits 26 can comprise AND gates if the reset inputs of the scan flip-flops 24 are active high. Other configurations for the control circuits 26 are possible.

The combinational logic circuitry 22 is configured to generate control signals to control operations within respective scan flip-flops 24. Exemplary operations comprise reset operations in the illustrated embodiment. In other configurations, the combinational logic circuitry 22 can control other functions of associated scan flip-flops 24.

The control circuits 26 individually include an input to receive control signals from the combinational logic circuitry 22. The control circuits 26 are preferably configured to selectively provide such received control signals to control inputs of respective scan flip-flops 24 during testing of the circuit 20 in the test mode of operation. As described below, the control circuits 26 are also preferably operable to selectively disable the provision of control signals received from the logic circuitry 22 to the respective control inputs of scan flip-flops 24 during the testing of the circuit 20. In the described embodiment, the control circuits 26 are also configured to pass the control signals received from the logic circuitry 22 to the respective control inputs of the flip-flops 24 during operation of the circuit 20 in the functional mode of operation.

The control circuits 26 also individually include an input adapted to receive an enable signal to control the selective provision of control signals received from the logic circuitry 22 to the control inputs of the respective scan flip-flops 24 during testing of the circuit 20. An exemplary enable signal includes the RESETnENABLE signal, where the letter "n" reflects potential presence of one or more other scan chains in addition to that associated with the circuit 20.

While individual outputs or flops from the scan flip-flops 24 are not normally accessible when an integrated circuit including the circuit 20 of FIG. 1 is actually manufactured, these outputs, labeled "Flop[0]" through "Flop[8]" in FIG. 1, can be made available during simulated operation of the circuit 20. It is desirable to reduce the number of input/output pins in the integrated circuit when it is manufactured, and this is why the scan chain is configured as a shift register. This configuration allows many different outputs from the combinational logic circuitry 22 of FIG. 1 to be sequentially read from a single output pin coupled to the Q output of the FF0 scan flip-flop 24. However, the scope of simulated output data includes very large amounts of data describing simulated operation of the circuit and includes the signals "Flop[0]" . . . "Flop[8]." These output data signals are generated; typically as text files, and it is extremely difficult and time-consuming to parse the circuit description together with the simulated output data to determine the nature and location of an error in the proposed design.

FIG. 3 is a simplified block diagram of a computer system incorporating novel aspects of the present invention and identified by reference numeral 40. The computer system 40 is configured to implement an electronic design automation (EDA) system 42 that is capable of simulating operation of a design for the circuit 20 of FIG. 1. A circuit designer inputs an integrated circuit design that includes design-for-testability features, validates the design, places components onto a chip layout and routes connections between components. According to one construction, an integrated circuit 46 under design and test comprises an application specific integrated circuit (ASIC) 48.

The electronic design automation (EDA) system 42 includes a central processing unit (CPU), or processor, 50, a memory 52 and a data storage device 54, all coupled to other elements of the system 42 via a bus 47. In one form, the memory 52 comprises a random access memory 56, a read only memory 58 and a data storage device 54. In one form, the data storage device 54 comprises a hard disk drive. The CPU 50 is used to implement an operating system and application programs, such as EDA and ATPG programs. Furthermore, the CPU 50 is used to implement the novel features of the present invention. A human designer, user or operator inputs design information into the system 42 via a keyboard 60 and/or a cursor manipulating tactile input device 62, such as a mouse or a touchpad. However, it is understood that other forms of input devices can also be used including voice recognition systems, joysticks, graphics tablets, data readers, card readers, magnetic and optical readers, other computer systems etc. The designer receives visual feedback on the design process via an output device 64. According to one construction, the output device 64 comprises a graphics display terminal, such as a CRT display or a liquid crystal display. During synthesis and testing of a design, the memory 52 is used to store logic design information for an integrated circuit 46 under design.

In operation, the designer specifies the logic design of the integrated circuit 48 via a commercially available form of design capture software 76 such as software that is commercially available from Synopsys, Inc. and Cadence Design Systems, Inc. A behavior description file 78 is output from the design capture software 76. The behavior description file 78 is written in a hardware description language (HDL), such as VHDL. The behavior description file 78 represents the logic design of a proposed design at a register transfer level.

The behavior description file 78 provides an input to a logic design synthesis program 80, such as a VHDL design compiler 81. The logic design synthesis program 80 is operative to create circuitry and gates necessary to realize a design that has been specified by the behavior description file 78. One commercially available VHDL design compiler is sold by Synopsys, Inc. The VHDL design compiler cooperates with the logic synthesis design compiler 78 to generate a detailed description file 82. The detailed description file 82 includes a gate-level definition of the logic design for the proposed integrated circuit design. The detailed description file 82 comprises a netlist for the design under consideration.

The detailed description file 82 is input into several EDA system programs such as an automatic test pattern generation (ATPG) program 84, as well as placement and routing tools, timing analyzers and simulation programs. The ATPG program 84 generates test patterns that are used in the system 42 to simulate operation of a proposed design for the integrated circuit 20 of FIG. 1, using a netlist, in the form of the detailed description file 82, that is input to the ATPG program 84. In accordance with the prior art, the system 42 provides simulated data output as a text file.

FIG. 5 is a simplified flow chart illustrating operation of an exemplary software module for processing and displaying the output file including simulated test data corresponding to the circuit 20 of FIG. 1 using the EDA system 42 of FIGS. 3 and 4, in accordance with an embodiment of the present invention. As used herein, the term "module" includes lines of code that may or may not be defined by a subroutine separate from the main program.

FIG. 5 illustrates a process "P1" that is initiated by the designer following or concurrently with utilization of the ATPG program 84 of FIG. 4 via the computer 40 of FIG. 3. According to step "S1," the scan enable signal "SCANENABLE" of FIG. 1 is simulated. After performing step "S1," the process "P1" proceeds to step "S2."

In step "S2," the process "P1" simulates a data capture signal, such as the RESETnENABLE signal of FIG. 1. After performing step "S2," the process "P1" proceeds to step "S3."

In step "S3," the process "P1" simulates scan chain data using the ATPG tool. After performing step "S3," the process "P1" proceeds to step "S4."

In step "S4," the process "P1" extracts simulated scan flops from the simulation data output by the ATPG tool 84 of FIG. 4. The extracted scan flops may include data corresponding, for example, to the signals "Flop[0]" through "Flop[8]" of FIG. 1. After performing step "S4," the process "P1" proceeds to step "S5."

In step "S5," the process "P1" sorts the simulated scan flops. In one embodiment, the step "S5" involves sorting the simulated scan flops into ordered groups, with each group of scan flops corresponding to a specific scan chain in the circuit 20 being simulated. In one embodiment, the simulated signals in each group are sorted into sequential order, e.g., "Flop[0]," "Flop[1]," . . . "Flop[8]." After performing step "S5," the process "P1" proceeds to step "S6."

In step "S6," the process "P1" identifies labels (e.g., "Flop[0]," etc.) for each of the simulated signals. After performing step "S6," the process "P1" proceeds to step "S7."

In step "S7," the process "P1" graphically displays the simulated signals (and their labels) selected by the designer versus time. In one embodiment, the process "P1" further displays test mode signals such as the reset enable signal RESETnENABLE or the scan enable signal SCANENABLE from FIG. 1, to facilitate interpretation of the scan flop data and to enable identification of the capture cycle (see FIGS. 4 through 6 and associated text). In one embodiment, the process "P1" optionally also displays expected results from one of the scan flops, such as the expected scan output data from FF0 of FIG. 1. After performing step "S7," the process "P1" proceeds to step "S8."

In step "S8," the process "P1" determines if the designer wishes to display simulated data corresponding to another scan chain. When the designer does not wish to display additional simulated data, the process "P1" ends. When the designer wishes to display additional simulated data, the process "P1" proceeds to step "S9."

In step "S9," the process "P1" determines which simulated data the designer wished to see displayed, and iterates steps "S4" through "S8" until the designer determines that no further simulated data need to be displayed.

FIG. 6 is a simplified graph showing correct simulated test results from the circuit 20 of FIG. 1 obtained via the system 42 of FIG. 3 using the process "P1" of FIG. 5, in accordance with an embodiment of the present invention. The top trace corresponds to the reset enable signal RESETnENABLE of FIG. 1, and allows the designer to identify the time period corresponding to the capture cycle (see vertical dashed lines corresponding to the RESETnENABLE signal going to logic "0"). The simulated signals "Flop[8]" through "Flop[0]" (see FIG. 1) are displayed in order below the reset signal RESETnENABLE. The bottom trace corresponds to the expected scan output data, in this case from simulation of an expected ScanOut signal (FIG. 1).

As exemplified by the dashed arrow extending from the "Flop[8]" signal diagonally down and to the right to terminate on the "Flop[0]" signal, data corresponding to flops 8 through 0 are propagating through the scan register 28 (FIG. 1) in an orderly fashion. Note that the dashed arrow may be laterally translated and still will show correct data propagation through the scan register 28. This indicates that there are no shift problems occurring in the scan register 28 in this simulation.

Comparison of the "Flop[0]" signal to the expected scan output 11 data signal also shows that the simulated data from the shift register are identical to the expected scan output data. This indicates that the simulation of the circuit 20 of FIG. 1 indicates proper operation, of this scan chain in this test, and this, in turn, fails to identify any problems with simulation of the combinational logic circuitry 22 or the chain including scan register 28.

FIG. 7 is a simplified graph showing simulated test results indicative of a shift problem from the circuit 20 of FIG. 1 obtained via the system 42 of FIG. 3 using the process "P1" of FIG. 5, in accordance with an embodiment of the present invention. The traces are organized as described above with respect to FIG. 6. In FIG. 7, comparison of the bottom two traces shows that the "Flop[0]" signal differs from the expected scan output data. This comparison, which may be carried out automatically, shows immediately that some form of error has occurred in the simulation, and an error message may be generated and may be displayed to indicate that the simulation has identified an error.

Comparison of the "Flop[2]" and "Flop[3]" signals shows that these two signals are identical. This comparison, which may be carried out by automatically comparing each possible pair of adjacent flops to determine if any two adjacent flops are identical, is a clear indication of a shift problem. An error message may be generated and may be displayed to indicate that the simulation has identified a shift problem and to indicate which pair of flops are associated with the shift problem. In the example shown, examination of the flop[2] and flop[3] clock signals is likely to show a large skew between them. Fixing or obviating the clock skew by, for example, adding a lockup latch or balancing the clock tree, will remedy the issue. In any event, the problem has been rapidly identified without having to resort to a large text file, parsing the netlist or the like.

FIG. 8 is a simplified graph showing simulated test results indicative of a capture problem from the circuit 20 of FIG. 1 obtained via the system 42 of FIG. 3 using the process "P1" of FIG. 5, in accordance with an embodiment of the present invention. The traces are organized as described above with respect to FIGS. 6 and 7, however, the expected scan output data trace is different, corresponding to either a different input vector or a different combinational logic circuitry 22 (FIG. 1). Because the erroneous simulated signal has propagated through the scan chain (scan register 28 in FIG. 1) as shown by the arrow, the scan behavior is correct. This indicates a data capture problem occurring in the FF7 flip-flop 24 of FIG. 1, and an error message indicating that a data capture problem exists with the flip-flop 24 providing the "Flop[7]" signal. Examining the simulated input signals to the FF7 flip-flop 24 is very likely to reveal the source of the problem. This allows the problem to be traced back through the scan chain without the designer having to interpret a complex text file, without having to parse the netlist corresponding to the circuit 20 and without any calculations. As, a result, the speed and accuracy with which the problem can be identified are both improved.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of discriminating between different types of scan failures, comprising:
    simulating a scan enable signal to a circuit represented by a netlist corresponding to a scan chain coupled to combinatorial logic being tested;
    simulating initiation of a data capture cycle in the netlist corresponding to the scan chain, the data capture cycle simulating circuit operation to provide simulated output data including a series of scan flops from the scan chain being simulated together with the combinatorial logic; and
    scanning data out from each flop in the scan chain and into a test program, the test program: extracting simulated scan flops from the simulated circuit operation data; sorting the simulated scan flops into a logical order; identifying labels for the simulated scan flops; and graphically displaying the simulated scan flops versus time together with the labels.

2. The method of claim 1, the test program further graphically displaying the simulated scan enable signal.

3. The method of claim 1, the test program further forming expected scan output data from the netlist using an automatic test pattern generator and forming a pseudo-signal graphically displaying miscompares between the displayed simulated scan flops and the expected scan output data.

4. The method of claim 1, the test program further forming a pseudo-signal graphically displaying miscompares between the simulated displayed scan flops and expected scan output data.

5. The method of claim 1, wherein extracting the simulated scan flops includes reducing a scope of the simulated output data to one scan chain to be analyzed.

6. The method of claim 1, wherein extracting the simulated scan flops includes reducing the scope of the output data to one scan chain to be analyzed and wherein sorting the simulated scan flops into a logical order includes sorting the simulated scan flops into a logical order extending from scan input to scan output.

7. The method of claim 1, the test program further comparing a selected one of the scan flops to expected scan output data to determine if the selected one of the scan flops agrees with the expected scan output data, and, when the selected one of the scan flops disagrees with the expected scan output data, providing an error message.

8. The method of claim 7, the test program further, after providing an error message, comparing the scan flops to determine if any adjacent two scan flops are identical, and, when two adjacent scan flops are determined to be identical, providing an indication of a transfer problem associated with the two identical adjacent scan flops, and, when no two adjacent scan flops are identical, providing an indication that a capture problem exists.

9. The method of claim 8, the test program further, after providing an indication that a capture problem exists, providing an indication of which scan flop has the capture problem.

10. An article of manufacture comprising:
    a computer usable medium having computer readable code embodied therein to cause a display to graphically depict one or more simulated scan output data sets versus time, the computer readable program code in the article of manufacture comprising:
    a module to extract the simulated scan flops of one or more scan chains from the simulated scan output data;
    a module to sort the extracted simulated scan flops into a logical order;
    a module to identify labels for the simulated extracted scan flops; and
    a module to graphically display the simulated scan flops versus time together with the labels.

11. The article of manufacture of claim 10, wherein the module to graphically display the simulated scan flops versus time is further configured to graphically display the simulated scan enable signal.

12. The article of manufacture of claim 10, the test program further including a module to form a pseudo-signal including data identifying miscompares between the simulated displayed scan flops and expected signal values, wherein the module to graphically display the simulated scan flops versus time also displays the pseudo-signal.

13. The article of manufacture of claim 10, the test program further including a module to form a pseudo-signal including data identifying miscompares between the simulated displayed scan flops and expected signal values derived from an automatic pattern generator, wherein the module to graphically display the simulated scan flops versus time is also configured to display the pseudo-signal.

14. The article of manufacture of claim 10, wherein the module to extract the simulated scan flops of one or more scan chains from the output data includes a module to reduce the scope of the simulated output data to one scan chain to be analyzed.

15. The article of manufacture of claim 10, wherein the module to extract the simulated scan flops of one or more scan chains from the simulated output data includes a module to reduce the scope of the simulated output data to one scan chain to be analyzed and wherein the module to sort the simulated extracted scan flops into a logical order is configured to sort the scan flops into a logical order extending from scan input to scan output.

16. A computer implemented circuit simulation and fault detection system comprising:
  memory configured to provide a database and operative to store a netlist including nets of an integrated circuit under design;
  an automatic test pattern generation algorithm operative to generate test patterns to test an integrated circuit design; and
  processing circuitry configured to simulate operation of the integrated circuit design to provide simulated circuit operation data and to identify types of defects occurring during simulation of the integrated circuit design and operative to: extract simulated scan flops from the simulated circuit operation data; sort the simulated scan flops into a logical order; identify labels for the simulated scan flops; and graphically display the simulated scan flops versus time together with the labels.

17. The circuit simulation system of claim 16, wherein the processing circuitry comprises a processor configured to implement the automatic test pattern generation program.

18. The circuit simulation system of claim 16, wherein the processing circuitry is further operative to graphically display the simulated scan enable signal.

19. The circuit simulation system of claim 16, wherein the processing circuitry is further operative to form expected scan output data from the netlist using an automatic test pattern generator and form a pseudo-signal graphically displaying miscompares between the displayed simulated scan flops and the expected scan output data.

20. The circuit simulation system of claim 16, wherein the processing circuitry is further operative to reduce the scope of the simulated output data to one scan chain to be analyzed.

21. The circuit simulation system of claim 16, wherein the processing circuitry is further operative to reduce the scope of the output data to one scan chain to be analyzed and sort the simulated scan flops into a logical order extending from scan input to scan output.

22. The circuit simulation system of claim 16, wherein the processing circuitry is further operative to compare a selected one of the scan flops to expected scan output data to determine if the selected one of the scan flops agrees with the expected scan output data, and, when the selected one of the scan flops disagrees with the expected scan output data, provide an error message.

23. The circuit simulation system of claim 22, wherein the processing circuitry is further operative to, after providing an error message, compare the scan flops to determine if any adjacent two scan flops are identical, and, when two adjacent scan flops are determined to be identical, provide an indication of a transfer problem associated with the two identical adjacent scan flops, and, when no two adjacent scan flops are identical, provide an indication that a capture problem exists.

24. The circuit simulation system of claim 23, wherein the processing circuitry is further operative to, after providing an indication that a capture problem exists, provide an indication of which scan flop has the capture problem.

* * * * *